US011005235B2

(12) United States Patent
Kim et al.

(10) Patent No.: US 11,005,235 B2
(45) Date of Patent: May 11, 2021

(54) METHOD FOR MANUFACTURING SURGE ABSORBING DEVICE

(71) Applicants: AJOU UNIVERSITY INDUSTRY-ACADEMIC COOPERATION FOUNDATION, Suwon-si (KR); SMART ELECTRONICS INC., Ulsan (KR)

(72) Inventors: Chang-Koo Kim, Seoul (KR); Hae-Min Lee, Suwon-si (KR); Doo Won Kang, Anyang-si (KR); Hyun Chang Kim, Ulsan (KR)

(73) Assignees: AJOU UNIVERSITY INDUSTRY-ACADEMIC COOPERATION FOUNDATION, Suwon-si (KR); SMART ELECTRONICS INC., Ulsan (KR)

( * ) Notice: Subject to any disclaimer, the term of this patent is extended or adjusted under 35 U.S.C. 154(b) by 416 days.

(21) Appl. No.: 15/755,417

(22) PCT Filed: Aug. 10, 2016

(86) PCT No.: PCT/KR2016/008795
§ 371 (c)(1),
(2) Date: Feb. 26, 2018

(87) PCT Pub. No.: WO2017/034186
PCT Pub. Date: Mar. 2, 2017

(65) Prior Publication Data

US 2018/0254612 A1 Sep. 6, 2018

(30) Foreign Application Priority Data

Aug. 27, 2015 (KR) ........................ 10-2015-0120640

(51) Int. Cl.
*H01T 4/02* (2006.01)
*H01T 21/00* (2006.01)
(Continued)

(52) U.S. Cl.
CPC ............ *H01T 4/12* (2013.01); *C23C 18/1651* (2013.01); *C23C 18/1692* (2013.01);
(Continued)

(58) Field of Classification Search
CPC .. H01T 4/02; H01T 4/12; H01T 21/00; H01C 1/024; H01C 1/026; H01L 2924/09701;
(Continued)

(56) References Cited

U.S. PATENT DOCUMENTS

2005/0241953 A1* 11/2005 Rine ................... C23C 18/1893 205/163
2012/0247223 A1* 10/2012 Sawchuk ................ C23C 18/36 73/861
2014/0327996 A1* 11/2014 Westebbe ................. H01T 4/12 361/120

FOREIGN PATENT DOCUMENTS

JP 1994-310252 A 11/1994
JP 1996-153565 A 6/1996
(Continued)

OTHER PUBLICATIONS

Machine Translation of Korean Patent Publication KR 10-1363820, Mar. 2020. (Year: 2014).*
(Continued)

*Primary Examiner* — A. Dexter Tugbang
(74) *Attorney, Agent, or Firm* — Sughrue Mion, PLLC

(57) ABSTRACT

A method for manufacturing a surge absorbing device is provided. The method includes providing an elongate ceramic tube having a hollow space defined therein and having open and opposite first and second end; forming a
(Continued)

first plating layer and a second plating layer on the first end and the second end, respectively; placing a surge absorbing element within the hollow space within the ceramic tube; disposing first and second brazing rings on the first plating layer and the second plating layer, respectively; disposing first and second sealing electrodes on the first and second brazing rings respectively; and melting the first and second brazing rings in an inert gas atmosphere to attach the first and second sealing electrodes onto the first plating layer and the second plating layer, respectively.

3 Claims, 4 Drawing Sheets

(51) Int. Cl.

| | |
|---|---|
| ***H01T 4/12*** | (2006.01) |
| ***C23C 18/50*** | (2006.01) |
| ***C23C 18/18*** | (2006.01) |
| ***C23C 18/16*** | (2006.01) |
| ***C23C 18/36*** | (2006.01) |
| *H01C 1/024* | (2006.01) |
| *H01C 1/026* | (2006.01) |

(52) U.S. Cl.
CPC .......... *C23C 18/1893* (2013.01); *C23C 18/36* (2013.01); *C23C 18/50* (2013.01); *H01T 21/00* (2013.01); *H01C 1/024* (2013.01); *H01C 1/026* (2013.01); *H01L 2924/09701* (2013.01); *H01T 4/02* (2013.01)

(58) Field of Classification Search
CPC ........... C23C 18/1651; C23C 18/1692; C23C 18/1893; C23C 18/36; C23C 18/50
See application file for complete search history.

(56) References Cited

FOREIGN PATENT DOCUMENTS

| | | | | |
|---|---|---|---|---|
| JP | 1997-63743 | A | | 3/1997 |
| JP | 2006236970 | A | * | 9/2006 |
| KR | 10-1363820 | | * | 2/2014 |
| KR | 10-1363820 | B1 | | 2/2014 |
| KR | 10-2014-0059611 | A | | 5/2014 |

OTHER PUBLICATIONS

Machine Translation of Korean Patent Publication, KR 10-1363820, Aug. 2020. (Year: 2020).*
Machine Translation of Korean Patent Publication, KR 10-2014-0059611 (also known as KR 10-1447110), Aug. 2020. (Year: 2020).*

* cited by examiner

[FIG. 1]
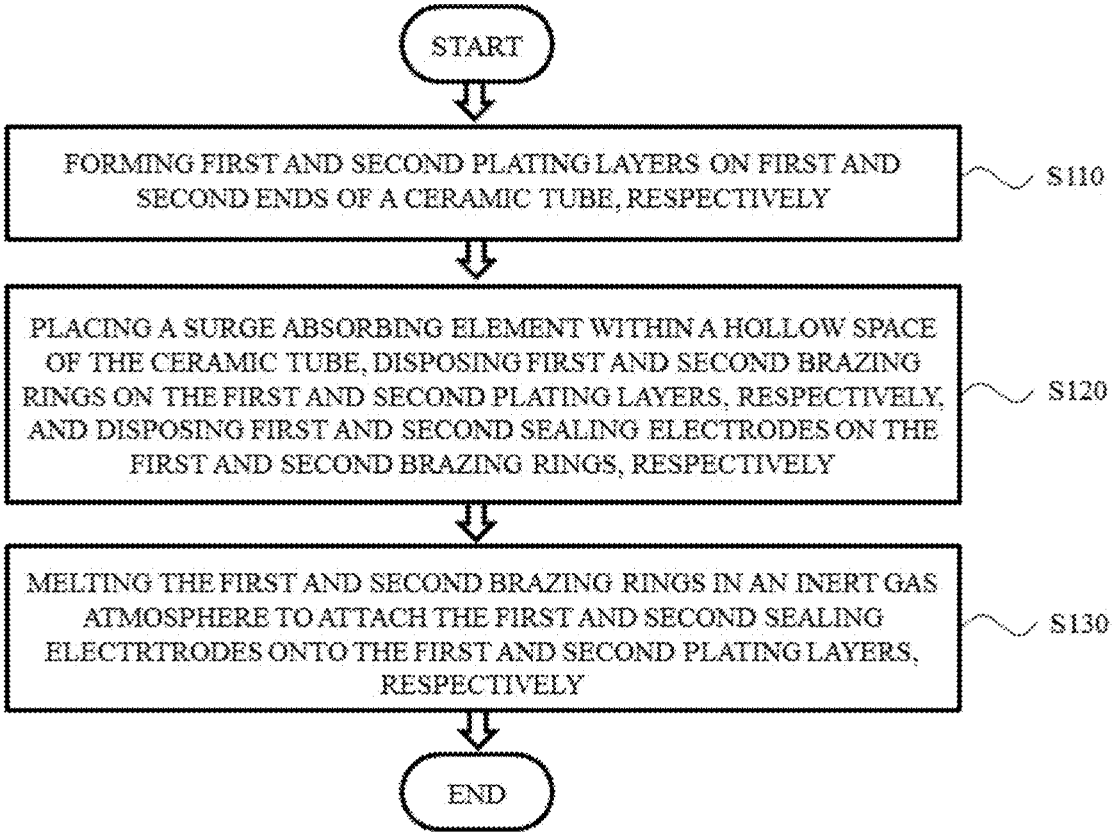

[FIG. 2]
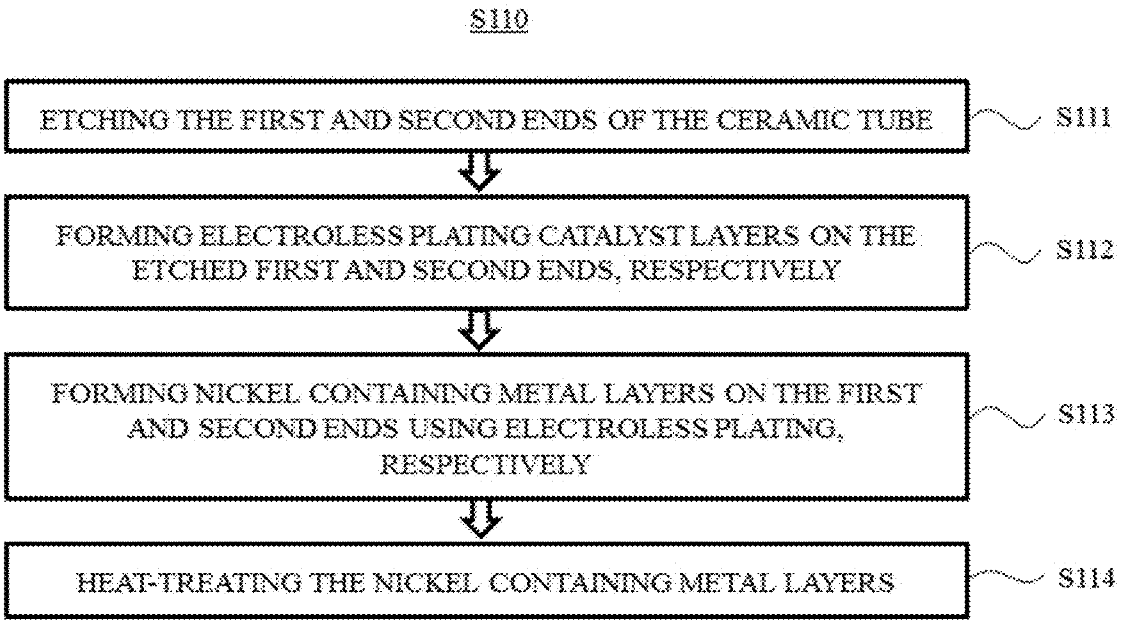
[FIG. 3]
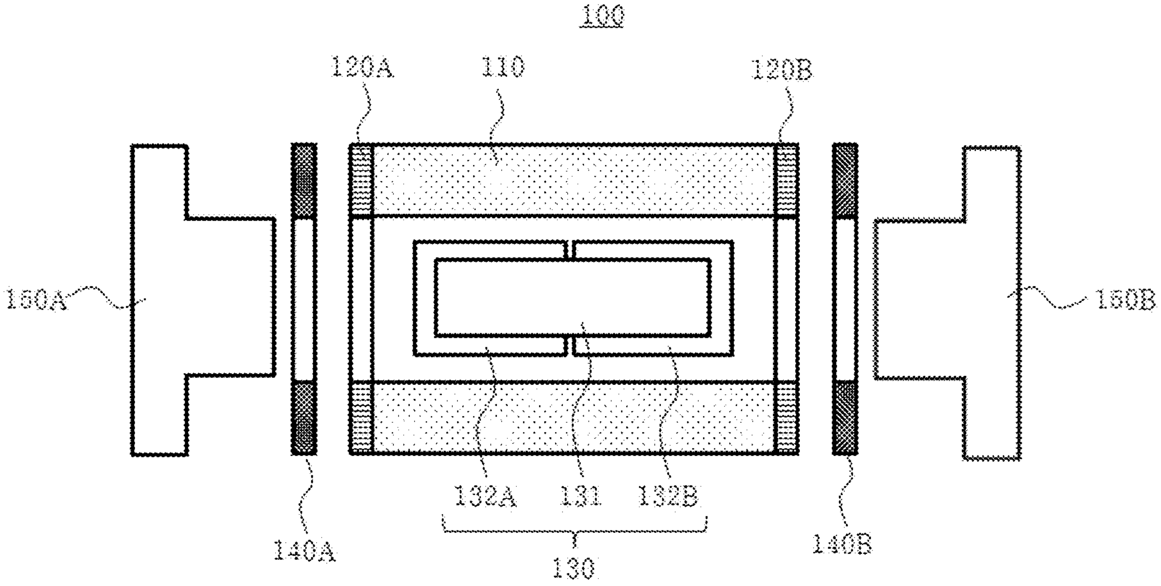

[FIG. 4A]
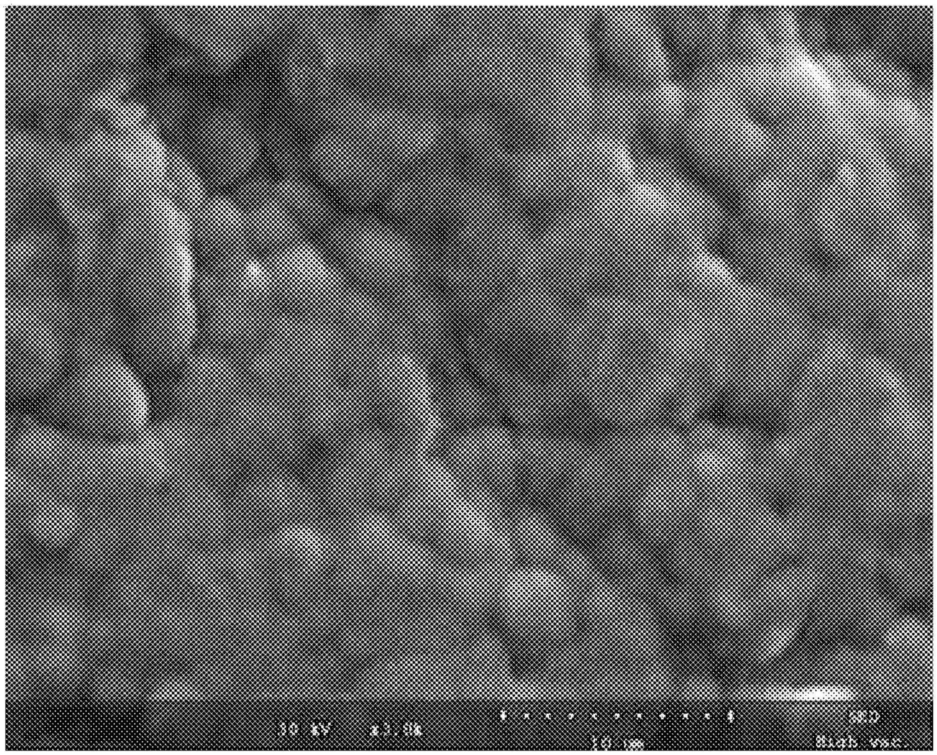
[FIG. 4B]
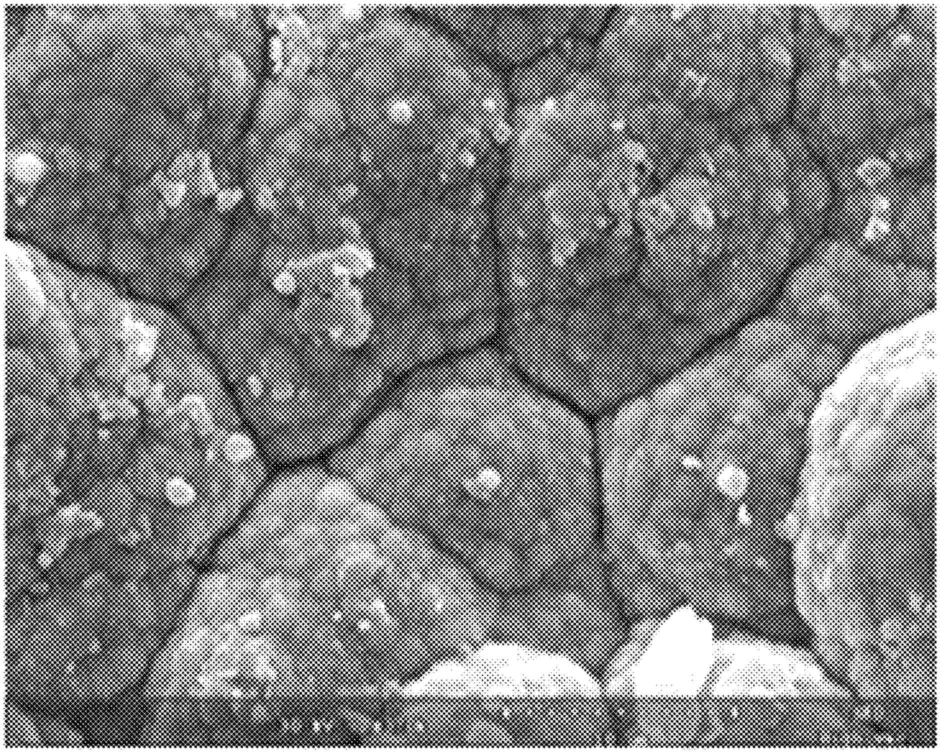

[FIG. 4C]
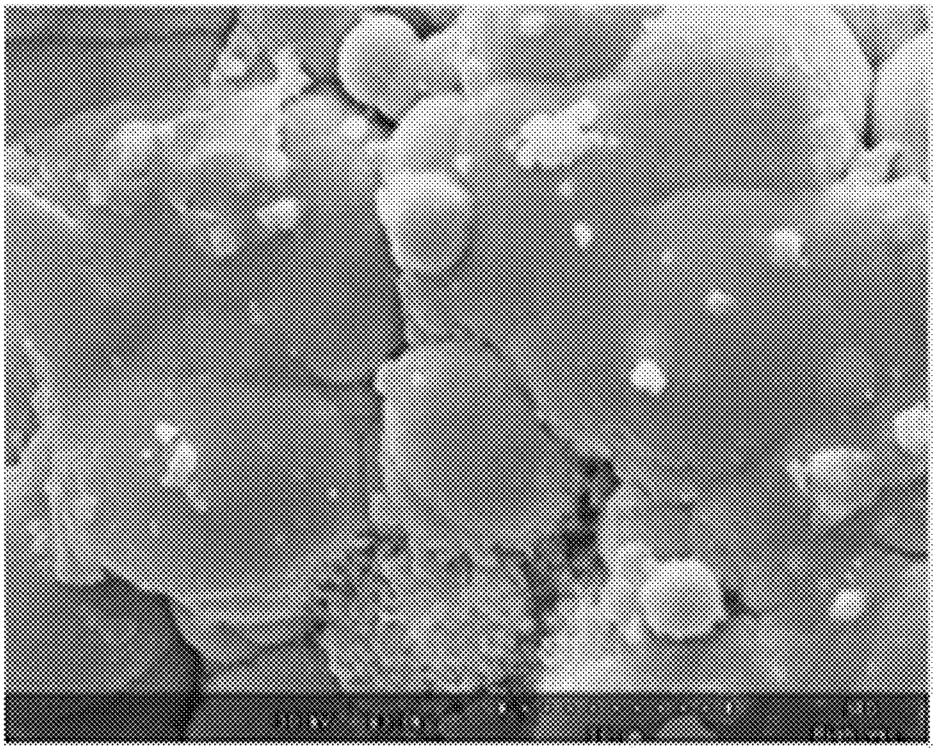
[FIG. 5]
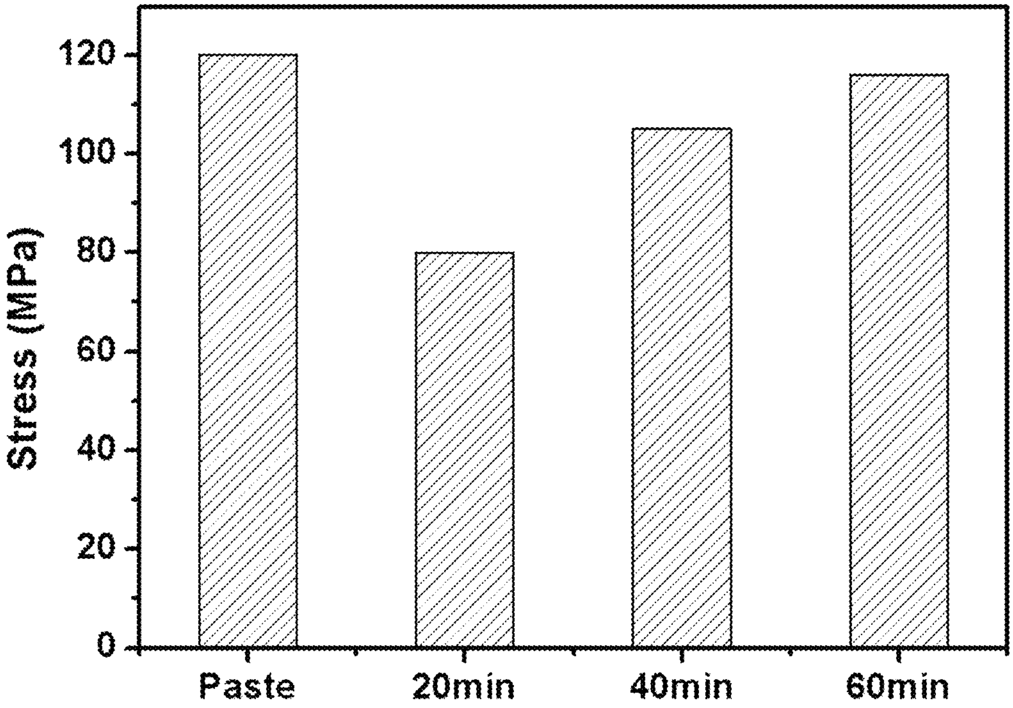

METHOD FOR MANUFACTURING SURGE ABSORBING DEVICE

CROSS-REFERENCE TO RELATED APPLICATION

This application is a National Stage of International Application No. PCT/KR2016/008795, filed on Aug. 10, 2016, which claims priority from Korean patent application No. 10-2015-0120640 filed on Aug. 27, 2015.

BACKGROUND

Field of the Present Disclosure

The present disclosure relates to a method for manufacturing a surge absorbing device capable of preventing the damage of an electric device by consuming discharge energy by gas discharge when an abnormal voltage is input thereto.

Discussion of Related Art

Generally, a surge absorbing device is installed in an area susceptible to electric shock due to abnormal voltage, such as a lightning surge or static electricity. The surge absorbing device consumes discharge energy by gas discharge when an abnormal voltage is input thereto, thereby preventing the printed board mounted with the electronic elements from being damaged by the abnormal voltage.

In such a surge absorbing device, a surge absorbing element is generally disposed inside a ceramic tube, and sealing electrodes are attached to both ends of the ceramic tube. Thereby, the inner space in the ceramic tube into which the discharge gas is injected is sealed. In this case, in order to stably bond the ceramic tube and the sealing electrodes to each other, a paste layer including a metal powder with a high melting point is formed on an end face of the ceramic tube. The paste layer is subjected to a heat treatment at a high temperature of 1300 to 1500° C. A plating layer is formed on the paste layer. The plating layer and the sealing electrode are bonded using a brazing ring made of an alloy of silver (Ag) and copper (Cu).

However, according to the above-described method, when manufacturing the surge absorbing device, the paste layer containing the refractory metal powder must be formed and be heat-treated at a high temperature for a long time. Thus, there is a problem that manufacturing cost and manufacturing time of the surge absorbing device are increased.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The purpose of the present disclosure is to provide a method for manufacturing a surge absorbing device, wherein the method is capable of securing a good bonding strength between the ceramic tube and the plating layer despite the formation of the nickel electroless plating layer directly on the end face of the ceramic tube.

In one aspect of the present disclosure, there is provided a method for manufacturing a surge absorbing device, the method comprising: forming a first plating layer and a second plating layer on a first end and a second end of a ceramic tube having a hollow space defined therein and exposed through the first and second ends, respectively; placing a surge absorbing element within the hollow space of the ceramic tube; disposing first and second brazing rings on the first plating layer and the second plating layer, respectively; disposing first and second sealing electrodes on the first and second brazing rings respectively; and melting the first and second brazing rings in an inert gas atmosphere to attach the first and second sealing electrodes onto the first plating layer and the second plating layer, respectively. The step of forming the first plating layer and the second plating layer on the first end and a second end respectively, may include etching the first end and the second end of the ceramic tube; forming first and second electroless plating catalyst layers on the etched first end and the etched second end respectively; forming first and second metal layers on the first end and the second end of the ceramic tube respectively using an electroless plating process; and heat-treating the first and second metal layers.

In one implementation, the first and second metal layers may include a first nickel layer and a second nickel layer formed by the electroless plating process using a nickel plating solution comprising a nickel precursor and a reducing agent, wherein the nickel precursor includes at least one selected from a group of consisting of nickel sulfate hydrate ($NiSO_4.6H_2O$) and nickel chloride hydrate ($NiCl_2.6H_2O$), and the reducing agent includes at least one selected from a group of consisting of sodium hypophosphite ($NaH_2PO_2$), sodium borohydride ($NaBH_4$), dimethylamine borane ($(CH_3)_2NHBH_3$), and hydrazine ($N_2H_4$).

In one implementation, the nickel plating solution may include a solution prepared by mixing, with respect to 1 liter of distilled water, about 15 to 25 grams of nickel chloride hydrate ($NiCl_2.6H_2O$), about 15 to 25 grams of sodium hypophosphite hydrate ($NaH_2PO_3.H_2O$), about 5 to 15 grams of sodium citrate tribasic dihydrate, and about 30 to 40 g of ammonium chloride ($NH_4Cl$) to form a mixed solution and by adjusting the mixed solution to have a pH of about 8 to 9 with about 15 to 25 wt. % of aqueous solution of sodium hydroxide (NaOH).

In one implementation, the first and second metal layers respectively may include a first nickel/molybdenum alloy layer and a second nickel/molybdenum alloy formed by the electroless plating process using a nickel/molybdenum alloy plating solution including a nickel precursor, a molybdenum precursor, and a reducing agent, wherein the nickel precursor may include ammonium nickel (II) sulfate ($(NH_4)_2Ni(SO_4)_2.7H_2O$), the molybdenum precursor may include ammonium molybdate (VI) ($(NH_4)_2MoO_4$), and the reducing agent may include at least one selected from the group of consisting of sodium hypophosphite ($NaH_2PO_2$), sodium borohydride ($NaBH_4$), dimethylamine borane ($(CH_3)_2NHBH_3$), and hydrazine ($N_2H_4$).

In one implementation, the nickel/molybdenum alloy plating solution may include a solution prepared by mixing, with respect to 1 liter of distilled water, about 35 to 45 g of ammonium nickel (II) sulfate ($(NH_4)_2Ni(SO_4)_2.7H_2O$), about 1 to 4 grams of ammonium molybdate (VI) ($(NH_4)_2MoO_4$), about 10 to 14 g of dimethylamine borane ($(CH_3)_2NHBH_3$), and about 35 to 45 grams of ammonium citrate ($HOC(CO_2NH_4)(CH_2CO_2NH_4)_2$) to form a mixed solution and by adjusting the mixed solution to have a pH of about 8 to 9 with an aqueous solution of tetramethylammonium hydroxide ($(CH_3)_4N(OH)$).

In one implementation, heat-treating the first and second metal layers may be carried out at about 350 to 450° C. for about 1 to 3 hours.

Conventionally, in order to improve the bonding strength between the plating film and the ceramic tube, a mixed powder paste between a high melting point metal such as molybdenum Mo, tungsten W and the like, and a manganese Mn is applied to the end of the ceramic tube, and then, the applied paste is heat-treated at a high temperature of about 1300 to 1500 DEG C., and, then, a plating layer is formed on the heat-treated paste.

However, when manufacturing the surge absorbing device according to the embodiment of the present disclosure, the formation of the paste layer containing the high melting point metal and the high temperature heat treatment of the paste are not performed. Nevertheless, since the plating layers having a high bonding strength may be formed onto the both ends of a ceramic tube, whereby, the manufacturing cost and the manufacturing time of the surge absorbing device may be remarkably reduced.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 1 is a flow chart illustrating a method for manufacturing a surge absorbing device according to an embodiment of the present disclosure.

FIG. 2 is a flow chart illustrating one embodiment of operation S110 of FIG. 1.

FIG. 3 is a cross-sectional view of a surge absorbing device manufactured according to the method of FIG. 1.

FIG. 4A is a scanning electron microscope (SEM) photograph of a sample prepared by forming a paste layer containing a high melting point metal on the face of a ceramic substrate and conducting nickel electroless plating on the paste layer, according to a conventional method.

FIG. 4B is a scanning electron microscope (SEM) photograph of a sample prepared by conducting nickel electroless plating directly on the ceramic substrate surface without performing heat treatment, according to the present disclosure.

FIG. 4C is a scanning electron microscope (SEM) photograph of a sample prepared as in FIG. 4B after the sample is subjected to heat treatment at 400° C. for 1 hour.

FIG. 5 is a graph of bond strengths between a ceramic substrate and a plating layer for a sample 'Paste' prepared by forming a paste layer containing a high melting point metal on a ceramic substrate surface and performing nickel plating on the paste layer according to a conventional method, and samples '20 min', '40 min', '60 min' prepared by performing nickel electroless plating directly on an alumina substrate surface and heat-treating the nickel plate at a temperature of 400° C. for 20 minutes, 40 minutes, and 60 minutes, respectively, according to the present disclosure.

DETAILED DESCRIPTIONS

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

FIG. 1 is a flow chart illustrating a method for manufacturing a surge absorbing device according to an embodiment of the present disclosure. FIG. 2 is a flow chart illustrating one embodiment of operation S110 of FIG. 1. FIG. 3 is a cross-sectional view of a surge absorbing device manufactured according to the method of FIG. 1.

Referring to FIG. 1 to FIG. 3, a method for manufacturing a surge absorbing device 100, according to an embodiment of the present disclosure may include forming a first plating layer 120A and a second plating layer 120B on a first end and a second end of a ceramic tube 110 having a hollow space defined therein and exposed through the first and second ends, respectively (S110);

placing a surge absorbing element 130 within the hollow space of the ceramic tube 110, disposing first and second brazing rings 140A and 140B on the first plating layer 120A and the second plating layer 120B respectively, and disposing first and second sealing electrodes 150A and 150B on the first and second brazing rings 140A and 140B respectively (S120); and melting the first and second brazing rings 140A and 140B in an inert gas atmosphere to attach the first and second sealing electrodes 150A and 150B onto the first and second plating layers 120A and 120B, respectively (S130).

First, the first and second plating layers 120A and 120B may be formed on the first and second ends of the ceramic tube 110, respectively S110.

The ceramic tube 110 may be formed of a ceramic material. The ceramic material may contain alumina $Al_2O_3$ as a main component, and may further contain silica $SiO_2$, calcium oxide CaO, magnesium oxide MgO, and the like. The ceramic tube 110 has a hollow space which is defined therein and passes therethrough. For example, the ceramic tube 110 may have a rectangular or circular tube shape. The hollow space may be exposed through the first end and the second end of the ceramic tube 110, which are opposite to each other.

The first plating layer 120A and the second plating layer 120B may be formed on the outer face of the first end and the outer face of the second end of the ceramic tube 110, respectively.

In one embodiment, the step S110 of forming the first plating layer 120A and the second plating layer 120B may comprise, as shown in FIG. 2, a step S111 of etching the first end and the second end of the ceramic tube 110, a step S112 of forming electroless plating catalyst layers on the etched first end and the etched second end, respectively, a step S113 of respectively forming metal layers on the first end and the second end of the ceramic tube 110 using a electroless plating process, and a step S114 of heat-treating the metal layers.

The step S111 of etching the first and second ends of the ceramic tube 110 may be performed by exposing the ends of the ceramic tube 110 to hydrogen fluoride HF or hydrochloric acid HCl. When the ends of the ceramic tube 110 are chemically etched, the surface roughness of each end of the ceramic tube 110 may be increased. Thereby, the adhesion strength between the plating layers 120A and 120B to be formed later and the ceramic tube 110 may be improved. In one embodiment, the ends of the ceramic tube 110 may be etched by immersing the first and second ends of the ceramic tube 110 in about 15 to 25 wt. % hydrogen fluoride (HF) aqueous solution for about 2 to 4 minutes.

The step S112 of respectively forming the electroless plating catalyst layers on the first end and the second end of the ceramic tube 110 may be performed by immersing the ends of the ceramic tube 110 in the catalyst metal-containing solution. The catalytic metal containing solution may comprise an aqueous solution in which the catalytic metal precursor material is dissolved. In one embodiment, as the catalyst metal-containing solution, an aqueous solution in which palladium chloride $PdCl_2$, hydrogen fluoride HF and hydrochloric acid HCl are dissolved may be used. For example, the catalytic metal-containing solution may be produced by mixing about 0.1 to 0.5 grams of palladium chloride, about 3 to 7 milliliters mL of hydrogen fluoride at 45 to 55 wt. %, and about 2 to 5 milliliters of 40 wt. % hydrochloric acid, with respect to 1 liter of distilled water. The electroless plating catalyst layers oxidize a reducing agent contained in the plating solution to release electrons during the electroless plating to be performed later, and thus metal ions in the plating solution are reduced by these electrons. As a result of the reduction of the metal ions, the metal layer may be formed on the ends of the ceramic tube 110.

In the step S113 of forming the metal layers on the first end and the second end of the ceramic tube 110 by an electroless plating method, the metal layers may be a metal layer including nickel.

In one embodiment, each of the metal layers may be a pure nickel layer. In this case, the electroless plating of the pure nickel layer may be performed using a nickel plating solution containing a nickel precursor and a reducing agent. As the nickel precursor, at least one of nickel sulfate hydrate ($NiSO_4.6H_2O$) and nickel chloride hydrate ($NiCl_2.6H_2O$) may be used. As the reducing agent, sodium hypophosphite ($NaH_2PO_2$), sodium borohydride ($NaBH_4$), dimethylamine borane ($(CH_3)_2NHBH_3$), hydrazine ($N_2H_4$) may be used alone or in combination of two or more thereof.

In another embodiment, each of the metal layers may be an alloy layer of nickel and molybdenum. In this case, the electroless plating of the alloy of nickel and molybdenum may be performed using a nickel/molybdenum alloy plating solution including a nickel precursor, a molybdenum precursor and a reducing agent. As the nickel precursor, ammonium nickel (II) sulfate ($(NH_4)_2Ni(SO_4)_2.7H_2O$) may be used. As the molybdenum precursor, ammonium molybdate (VI) ($(NH_4)_2MoO_4$) may be used. As the nickel precursor, at least one of nickel sulfate hydrate ($NiSO_4.6H_2O$) and nickel chloride hydrate ($NiCl_2.6H_2O$) may be used. As the reducing agent, sodium hypophosphite ($NaH_2PO_2$), sodium borohydride ($NaBH_4$), dimethylamine borane ($(CH_3)_2NHBH_3$), hydrazine ($N_2H_4$) may be used alone or in combination of two or more thereof.

Each of the nickel plating solution and the nickel/molybdenum alloy plating solution may further include a pH adjusting agent, a buffering agent, a complexing agent, an accelerator, a stabilizer, and the like.

The pH adjusting agent affects the plating rate, reduction efficiency and plating film state associated with the electroless nickel plating. As the pH adjusting agent, for example, basic compounds such as sodium hydroxide and ammonium hydroxide, organic acids, inorganic acids, etc. may be used singly or in combination of two or more thereof.

The buffering agent may buffer the pH change caused by the reduction of the nickel ion. As the buffering agent, for example, sodium citrate, sodium acetate, boric acid, carbonic acid, etc. may be used singly or in combination of two or more thereof.

The complexing agent prevents the precipitation of nickel ions and thus prolongs the lifetime of the plating solution. Examples of the complexing agent include alkali salts of organic acids such as glycolic acid, citric acid, tartaric acid and the like, or thioglycolic acid, ammonia, hydrazine, triethanolamine, ethylenediamine, glycerin, pyridine, etc. They may be used alone or in combination of two or more.

The accelerator accelerates the rate of the nickel plating, suppresses the generation of hydrogen gas, thereby to improve the nickel precipitation efficiency. As the accelerator, for example, a sulfide, a fluoride or the like may be used.

The stabilizer may inhibit the reduction reaction from occurring on surfaces other than the surface to be plated with nickel ions. As the stabilizer, for example, a lead salt, a lead sulfide, a nitrate compound, etc. may be used singly or in combination of two or more.

In one embodiment, the nickel plating solution may be prepared as follows.

With respect to 1 liter of distilled water, about 15 to 25 grams of nickel chloride hydrate ($NiCl_2.6H_2O$), about 15 to 20 grams of sodium hypophosphite hydrate ($NaH_2PO_3.H_2O$), about 5 to 15 grams of sodium citrate tribasic dihydrate, about 30 to 35 g of ammonium chloride ($NH_4Cl$) may be mixed to form a mixed solution. Then, the mixed solution is adjusted to have a pH of about 8 to 9 with about 15 to 25 wt. % of aqueous solution of sodium hydroxide (NaOH).

In another embodiment, the nickel/molybdenum alloy plating solution may be prepared as follows. With respect to 1 liter of distilled water, about 35 to 45 g of ammonium nickel (II) sulfate ($(NH_4)_2Ni(SO_4)_2.7H_2O$), about 1 to 4 grams of ammonium molybdate (VI) ($(NH_4)_2MoO_4$), about 10 to 14 g of dimethylamine borane ($(CH_3)_2NHBH_3$), and about 35 to 45 grams of ammonium citrate ($HOC(CO_2NH_4)(CH_2CO_2NH_4)_2$) may be mixed to form a mixed solution. Then, the mixed solution is adjusted to have a pH of about 8 to 9 with an aqueous solution of tetramethylammonium hydroxide ($(CH_3)_4N(OH)$).

The step 114 of heat-treating the metal layer formed by the electroless plating may be performed at a temperature of about 350 to 450° C. for about 1 to 3 hours.

By this heat treatment, the bonding strength between the first end and the second plating layer 120A, 120B formed by the electroless plating and the ceramic tube can be improved.

After forming the first and second plating layers 120A and 120B on the first end and the second end of the ceramic tube 110 respectively, a surge absorbing element 130 is disposed in the hollow space of the ceramic tube 110, and the first and second brazing rings 140A and 140B are formed on the first plating layer 120A and the second plating layer 120B, respectively. Then, the first and second sealing electrodes 150A, 150B may be disposed on the first and second brazing rings 140A, 140B, respectively (S120).

When an abnormal voltage due to lightning or static electricity is applied to the surge absorbing element 130, the surge absorbing element 130 may discharge an inert gas such as argon, which is sealed in the hollow space of the ceramic tube 110. Any element capable of implementing this function may be used without limitation as the surge absorbing element 130.

In one embodiment, the surge absorbing element 130 includes a non-conductive body 131, a first discharge electrode 132A formed to surround the first end of the non-conductive body 131, and a second discharge electrode 132B formed to surround the second end of the non-conductive body 131 and separated from the first discharge electrode 132A.

In one example, the non-conductive body 131 may have a cylindrical shape. The first discharge electrode 132A and the second discharge electrode 132B may cover the side faces and the end faces of the non-conductive body 131 such that the first discharge electrode 132A and the second discharge electrode 132B may be spaced apart from each other by a small gap.

The first sealing electrode 150A may be disposed on the first plating layer 120A. In one embodiment, the first sealing electrode 150A may include a first support portion disposed outside the hollow space of the ceramic tube 110 and joined to the first plating layer 120A by the first brazing ring 140A, and a first contact portion protruding from the first support portion to be inserted into the hollow space of the ceramic tube 110 and being in electrical contact with the first discharge electrode 132A of the surge absorbing element 130. The first brazing ring 140A has a first opening communicating with the hollow space of the ceramic tube 110. The first brazing ring 140A may be disposed between the first plating layer 120A and the first support portion of the first sealing electrode 150A.

The second sealing electrode 150B may be disposed on the second plating layer 120B. In one embodiment, the second sealing electrode 150B may include a second support portion disposed outside the hollow space of the ceramic tube 110 and joined to the second plating layer 120B by the second brazing ring 140B, and a second contact portion protruding from the second support portion to be inserted into the hollow space of the ceramic tube 110 and being in electrical contact with the second discharge electrode 132A of the surge absorbing element 130. The second brazing ring 140B has a second opening communicating with the hollow space of the ceramic tube 110. The second brazing ring 140B may be disposed between the second plating layer 120B and the second support portion of the second sealing electrode 150B.

In one embodiment, each of the first end and second brazing rings 140A and 140B may be formed of a metal or alloy material having excellent bonding properties with the first and second plating layers 120A and 120B. For example, each of the first and second brazing rings 140A and 140B may be formed of an alloy including silver Ag and copper Cu.

In one embodiment, each of the first and second sealing electrodes 150A and 150B may be formed of a metal or alloy material having good electrical conductivity and excellent bonding properties with the first and second brazing rings 140A and 140B. For example, each of the first and second sealing electrodes 150A and 150B may be formed of an alloy material including iron Fe and nickel Ni.

Next, the first and second brazing rings 140A and 140B are melted in an inert gas atmosphere. As such, the first and second sealing electrodes 150A and 150B may be attached on the first and second plating layers 120A and 120B, respectively S130.

As the inert gas, argon may be used. The inert gas is injected into the hollow space of the ceramic tube 110 so that the first and second sealing electrodes 150A and 150B are attached to the first and second plating layers 120A and 120B, respectively in the inert gas.

Conventionally, in order to improve the bonding strength between the plating film and the ceramic tube, a mixed powder paste between a high melting point metal such as molybdenum Mo, tungsten W and the like, and a manganese Mn is applied to the end of the ceramic tube, and then, the applied paste is heat-treated at a high temperature of about 1300 to 1500° C., and, then, a plating layer is formed on the heat-treated paste.

However, when manufacturing the surge absorbing device according to the embodiment of the present disclosure, the formation of the paste layer containing the high melting point metal and the high temperature heat treatment of the paste are not performed.

Nevertheless, since the plating layers having a high bonding strength may be formed onto the both ends of a ceramic tube, whereby, the manufacturing cost and the manufacturing time of the surge absorbing device may be remarkably reduced.

FIG. 4A is a scanning electron microscope (SEM) photograph of a sample prepared by forming a paste layer containing a high melting point metal on the face of a ceramic substrate and conducting nickel electroless plating on the paste layer, according to a conventional method. FIG. 4B is a scanning electron microscope (SEM) photograph of a sample prepared by conducting nickel electroless plating directly on the ceramic substrate surface without performing heat treatment, according to the present disclosure. FIG. 4C is a scanning electron microscope (SEM) photograph of a sample prepared as in FIG. 4B after the sample is subjected to heat treatment at 400° C. for 1 hour.

Referring to FIG. 4A to FIG. 4C, in the case of the sample in FIG. 4C, it may be confirmed that the nickel particles are agglomerated by heat treatment and have a particle shape similar to the sample in FIG. 4A.

FIG. 5 is a graph of bond strengths between a ceramic substrate and a plating layer for a sample 'Paste' prepared by forming a paste layer containing a high melting point metal on a ceramic substrate surface and performing nickel plating on the paste layer according to a conventional method, and samples '20 min', '40 min', '60 min' prepared by performing nickel electroless plating directly on an alumina substrate surface and heat-treating the nickel plate at a temperature of 400° C. for 20 minutes, 40 minutes, and 60 minutes, respectively, according to the present disclosure.

Referring to FIG. 5, it may be confirmed that the sample '60 min' as prepared by performing nickel electroless plating directly on an alumina substrate surface and heat-treating the nickel plate at a temperature of 400° C. for 60 minutes according to the present disclosure may have substantially the same bonding strength as that of the sample 'Paste' prepared by forming a paste layer containing a high melting point metal on a ceramic substrate surface and performing nickel plating on the paste layer according to a conventional method. Accordingly, a bonding strength between the ceramic tube and the plating layer when the plating layer is formed on the ceramic tube and the plate layer is subjected to heat treatment at a temperature of about 400° C. for about 1 hour or more according to the present disclosure may be substantially the same as a bonding strength between the ceramic tube and the plating layer when a paste layer containing a high-melting-point metal is formed on a ceramic substrate surface, and then nickel plating is performed thereon according to a conventional method.

While the foregoing is directed to preferred embodiments of the present disclosure, those skilled in the art will appreciate that various modifications, additions and substitutions are possible, without departing from the spirit and scope of the present disclosure as set forth in the following claims.

What is claimed is:

1. A method for manufacturing a surge absorbing device, the method comprising:

forming a first plating layer and a second plating layer on a first end and a second end of a ceramic tube having a hollow space defined in the ceramic tube and exposed through the first and second ends, respectively;

placing a surge absorbing element within the hollow space of the ceramic tube;

disposing first and second brazing rings on the first plating layer and the second plating layer, respectively;

disposing first and second sealing electrodes on the first and second brazing rings respectively; and melting the first and second brazing rings in an inert gas atmosphere to attach the first and second sealing electrodes onto the first plating layer and the second plating layer, respectively, wherein the forming of the first plating layer and the second plating layer on the first end and the second end respectively, comprises:

etching the first end and the second end of the ceramic tube;

forming first and second electroless plating catalyst layers on the etched first end and the etched second end respectively;

forming first and second metal layers on the first end and the second end of the ceramic tube respectively using an electroless plating process;

heat-treating the first and second metal layers, wherein the first and second metal layers respectively comprise a first nickel layer and a second nickel layer formed by the electroless plating process using a nickel plating solution comprising a nickel precursor and a reducing agent, wherein the nickel precursor comprises at least one selected from the group of consisting of nickel sulfate hydrate ($NiSO_4.6H_2O$) and nickel chloride hydrate ($NiCl_2.6H_2O$), and wherein the reducing agent comprises at least one selected from the group of consisting of sodium hypophosphite ($NaH_2PO_2$), sodium borohydride ($NaBH_4$), dimethylamine borane ($(CH_2)_2NHBH_3$), and hydrazine ($N_2H_4$).

2. The method of claim 1, wherein the nickel plating solution comprises a solution prepared by mixing, with respect to 1 liter of distilled water, about 15 to 25 grams of nickel chloride hydrate ($NiCl_2.6H_2O$), about 15 to 25 grams of sodium hypophosphite hydrate ($NaH_2PO_3.H_2O$), about 5 to 15 grams of sodium citrate tribasic dihydrate, and about 30 to 40 g of ammonium chloride ($NH_4Cl$) to form a mixed solution and by adjusting the mixed solution to have a pH of about 8 to 9 with about 15 to 25 wt. % of aqueous solution of sodium hydroxide (NaOH).

3. The method of claim 1, wherein heat-treating the first and second metal layers is carried out at about 350 to 450° C. for about 1 to 3 hours.

* * * * *